(12) United States Patent
Sakaguchi et al.

(10) Patent No.: US 7,567,014 B2
(45) Date of Patent: Jul. 28, 2009

(54) ENERGY TRAP PIEZOELECTRIC RESONATOR

(75) Inventors: Hitoshi Sakaguchi, Yasu (JP); Hiroaki Kaida, Moriyama (JP); Takashi Hase, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 580 days.

(21) Appl. No.: 10/559,240

(22) PCT Filed: Apr. 20, 2005

(86) PCT No.: PCT/JP2005/007501

§ 371 (c)(1),
(2), (4) Date: Nov. 30, 2005

(87) PCT Pub. No.: WO2006/040851

PCT Pub. Date: Apr. 20, 2006

(65) Prior Publication Data

US 2008/0179994 A1  Jul. 31, 2008

(30) Foreign Application Priority Data

Oct. 14, 2004 (JP) ............................. 2004-300406
Mar. 25, 2005 (JP) ............................. 2005-088657

(51) Int. Cl.
*H01L 41/047* (2006.01)
(52) U.S. Cl. ..................................... 310/320; 310/366
(58) Field of Classification Search ................. 310/320, 310/321, 365, 366
See application file for complete search history.

(56) References Cited

U.S. PATENT DOCUMENTS

| 2,969,512 | A | * | 1/1961 | Hans et al. | ................... | 333/187 |
| 3,585,418 | A | * | 6/1971 | Koneval | ..................... | 310/326 |
| 4,870,313 | A | * | 9/1989 | Hirama et al. | .............. | 310/320 |
| 5,294,860 | A | * | 3/1994 | Gamo | ........................ | 310/320 |
| 5,696,423 | A | * | 12/1997 | Dydyk et al. | ............... | 310/346 |

(Continued)

FOREIGN PATENT DOCUMENTS

JP  04-216208  8/1992

(Continued)

OTHER PUBLICATIONS

International Search Report for PCT Application No. PCT/JP2005/007501. International Filing Date, Apr. 20, 2005.

*Primary Examiner*—Thomas M Dougherty
(74) *Attorney, Agent, or Firm*—Keating & Bennett, LLP

(57) ABSTRACT

An energy trap piezoelectric resonator makes use of a harmonic wave in a thickness longitudinal vibration mode and can effectively suppress a spurious fundamental wave in a thickness longitudinal vibration mode without significantly suppressing the harmonic wave that is used for the resonator. The energy trap piezoelectric resonator has a first excitation electrode disposed at an upper surface of a piezoelectric substrate polarized in a thickness direction and a second excitation electrode disposed at a lower surface, and a floating electrode disposed at at least one of the upper surface and/or the lower surface of the piezoelectric substrate so as to extend towards and away from the first excitation electrode with respect to a node of an electric potential distribution based on electric charges generated by the fundamental wave that is propagated when an energy trap vibration portion where the excitation electrodes oppose each other is excited.

11 Claims, 7 Drawing Sheets

U.S. PATENT DOCUMENTS

| | | | | |
|---|---|---|---|---|
| 5,773,912 A * | 6/1998 | Saeki et al. | | 310/326 |
| 6,040,652 A * | 3/2000 | Kaida | | 310/320 |
| 6,274,964 B1 * | 8/2001 | Yoshida et al. | | 310/321 |
| 6,492,759 B1 * | 12/2002 | Watanabe | | 310/320 |
| 6,903,489 B2 * | 6/2005 | Suzuki et al. | | 310/320 |
| 2004/0195937 A1 * | 10/2004 | Matsubara et al. | | 310/320 |

FOREIGN PATENT DOCUMENTS

| | | | |
|---|---|---|---|
| JP | 09-181556 | | 7/1997 |
| JP | 11-177375 | | 7/1999 |
| JP | 2000-278077 | | 10/2000 |
| JP | 2000-341072 | | 12/2000 |
| JP | 2005-094542 | * | 4/2005 |

* cited by examiner

ENERGY TRAP PIEZOELECTRIC RESONATOR

BACKGROUND OF THE INVENTION

1. Field of the Invention

The present invention relates to an energy trap piezoelectric resonator used for, for example, a piezoelectric oscillator, and, more particularly, to an energy trap piezoelectric resonator making use of a harmonic wave in a thickness longitudinal vibration mode.

2. Description of the Related Art

Previously, higher frequencies in electronic devices have caused various energy trap resonators making use of a harmonic wave in a thickness longitudinal vibration mode to be proposed.

For example, Japanese Unexamined Patent Application Publication No. 4-216208 discloses a piezoelectric resonator shown in FIG. 10.

A piezoelectric resonator 101 includes a rectangular plate piezoelectric substrate 102. The piezoelectric substrate 102 is formed of piezoelectric ceramics polarized in a thickness direction. A first excitation electrode 103 is provided at the center of an upper surface of the piezoelectric substrate 102, and a second excitation electrode 104 is provided at the center of a lower surface of the piezoelectric substrate 102 so as to oppose the excitation electrode 103. A portion where the excitation electrodes 103 and 104 oppose each other is a piezoelectric vibration portion.

The excitation electrodes 103 and 104 are electrically connected to extraction electrodes 105 and 106, respectively. In the piezoelectric resonator 101, a third harmonic wave in a thickness longitudinal vibration mode is used. Therefore, since a fundamental wave in a thickness longitudinal vibration mode becomes spurious, it is desirable to suppress the fundamental wave. Consequently, in the piezoelectric resonator 101, partial electrodes 107 and 108 are provided on the upper surface of the piezoelectric substrate 101 so as to extend along side edges 102a and 102b of the piezoelectric substrate 102, respectively. Partial electrodes 109 and 110 are also provided on the lower surface so as to extend along respective side edges.

In the piezoelectric resonator 101, when the fundamental wave is being transmitted from the piezoelectric vibration portion to a surrounding area, and the partial electrodes 107 to 110 are provided, the fundamental wave is suppressed by a piezoelectric short-circuit effect and mechanical loads of the partial electrodes 107 to 110. In other words, the document states that the fundamental wave can be suppressed by making use of mass loading of the partial electrodes 107 to 110.

Japanese Unexamined Patent Application Publication No. 11-177375 discloses a piezoelectric resonator shown in FIG. 11. In a piezoelectric resonator 151, a first excitation electrode 153 is provided at an upper surface of a rectangular plate piezoelectric substrate 152, and a second excitation electrode 154 is provided at a lower surface of the piezoelectric substrate 152. A portion where the excitation electrodes 153 and 154 oppose each other with the piezoelectric substrate 152 disposed therebetween is an energy trap piezoelectric vibration portion. This document states that the piezoelectric substrate 152 is polarized in the thickness direction and that a third harmonic wave in a thickness longitudinal vibration mode is used. The excitation electrodes 153 and 154 are provided consecutively with extraction electrodes 155 and 156, respectively. The extraction electrode 156 is connected to a mounting electrode 158 through an end surface of the piezoelectric substrate 152.

In the piezoelectric resonator 151, a floating electrode 157 is provided on the upper surface of the piezoelectric substrate 152 so as to be situated at a side opposite to the side towards which the excitation electrode 153 is extended with respect to the extraction electrode 155. Here, a fundamental wave which is transmitted from the piezoelectric vibration portion to a surrounding area is suppressed in a thickness longitudinal vibration mode by mass loading of the floating electrode 157, so that a resonance characteristic in which the third harmonic wave in a thickness longitudinal vibration mode can be effectively used.

As stated in Japanese Unexamined Patent Application Publication No. 4-216208 and Japanese Unexamined Patent Application Publication No. 11-177375, various structures making use of mass loading of metallic materials of which the electrodes are made have been proposed in order to suppress the fundamental wave in a thickness longitudinal vibration mode. In other words, since the fundamental wave becomes spurious when a harmonic wave in a thickness longitudinal vibration mode is used, there has been a strong demand for suppressing the fundamental wave. In order to suppress the fundamental wave by mass loading, an attempt has been made to dispose the partial electrodes 107 to 110 or floating electrode 157 around the piezoelectric vibration portion.

However, in the related structures which try to suppress the fundamental wave by mass loading, it is difficult to sufficiently suppress response by the fundamental wave when making use of a harmonic wave in a thickness longitudinal vibration mode. In addition, when the fundamental wave is sufficiently suppressed by a large mass load, the response of the harmonic wave in a thickness longitudinal vibration mode tends to be suppressed too.

SUMMARY OF THE INVENTION

In order to overcome the problems described above, preferred embodiments of the present invention provide an energy trap piezoelectric resonator which makes use of a harmonic wave in a thickness longitudinal vibration mode, which effectively suppresses a fundamental wave in a thickness longitudinal vibration mode, and which properly makes use of a response based on the harmonic wave.

An energy trap piezoelectric resonator makes use of a harmonic wave in a thickness longitudinal vibration mode and includes a piezoelectric substrate having opposing first and second principal surfaces, a first excitation electrode disposed at the first principal surface of the piezoelectric substrate, and a second excitation electrode disposed at the second principal surface of the piezoelectric substrate so as to oppose the first excitation electrode, a portion where the first and second excitation electrodes oppose each other being a piezoelectric vibration portion, and a vibration damping portion being disposed near the piezoelectric vibration portion. In the piezoelectric resonator, at least one floating electrode is disposed at least one of the first and second principal surfaces of the piezoelectric substrate so as to be situated near the piezoelectric vibration portion and so as to extend towards and away from the excitation electrodes with respect to a node serving as an origin, the node being a node of an electric potential distribution based on electric charges generated at the first and second principal surfaces of the piezoelectric substrate by a fundamental wave in a thickness longitudinal vibration mode.

In a particular aspect of the energy trap piezoelectric resonator according to a preferred embodiment of the present invention, the first and second excitation electrodes by which the piezoelectric vibration portion is provided are disposed inwardly of peripheral edges of the respective first and second principal surfaces of the piezoelectric substrate.

In another particular aspect of the energy trap piezoelectric resonator according to a preferred embodiment of the present invention, the at least one floating electrode is a substantially annular electrode disposed so as to surround the first excitation electrode and/or the second excitation electrode. The at least one annular electrode is preferably circular but may have other suitable shapes.

In still another particular aspect of the energy trap piezoelectric resonator according to a preferred embodiment of the present invention, the piezoelectric substrate preferably has an elongated substantially rectangular plate shape, the first excitation electrode is disposed so as to extend to a pair of side edges at two sides of the first principal surface of the piezoelectric substrate in a widthwise direction of the piezoelectric substrate, the second excitation electrode is disposed so as to extend to a pair of side edges at two sides of the second principal surface of the piezoelectric substrate in the widthwise direction of the piezoelectric substrate, and the vibration damping portion is disposed on both sides of the piezoelectric vibration portion in a longitudinal direction of the piezoelectric substrate.

In another particular aspect of the energy trap piezoelectric resonator according to a preferred embodiment of the present invention, the at least one floating electrode is disposed at only one side of the first excitation electrode and/or the second excitation electrode in the longitudinal direction of the piezoelectric substrate.

In the piezoelectric resonator according to a preferred embodiment of the present invention, the first excitation electrode and the second excitation electrode are disposed at the first principal surface and the second principal surface of the piezoelectric substrate, respectively. In addition, at least one floating electrode is provided at least one of the first and second principal surfaces so as to be situated near the piezoelectric vibration portion and so as to extend towards and away from the first and second excitation electrodes with respect to a node serving as an origin, the node being a node of the electric potential distribution generated at the first and second principal surfaces of the piezoelectric substrate by a fundamental wave in a thickness longitudinal vibration mode. Accordingly, when the piezoelectric resonator is excited, the fundamental wave is transmitted from the piezoelectric vibration portion to a surrounding area, and the electric potential distribution is generated. In the piezoelectric resonator according to a preferred embodiment of the present invention, an electric charge generated at a portion of the at least one floating electrode extending in the direction towards the excitation electrodes from the electric potential distribution node and an electric charge generated at a portion of the at least one floating electrode extending in the direction away from the excitation electrodes from the electric potential distribution node cancel each other out. Therefore, the piezoelectric resonator is constructed so that the at least one floating electrode prevents electric charges contributing to excitation of the fundamental wave from being generated. Consequently, the excitation of the fundamental wave can be effectively suppressed.

The at least one floating electrode eliminates the electric charges generated by the fundamental wave, and does not make use of mass loading of the at least one floating electrode itself. Therefore, the at least one floating electrode makes it difficult for a harmonic wave in a thickness longitudinal vibration mode to be suppressed.

Consequently, it is possible to provide an energy trap thickness longitudinal harmonic wave piezoelectric resonator which can effectively suppress the fundamental wave in a thickness longitudinal vibration mode, and which can properly make use of the harmonic wave in a thickness longitudinal vibration mode.

In a preferred embodiment of the present invention, since, as mentioned above, the at least one floating electrode operates so as to cancel the positive and negative electric charges generated by the fundamental wave, it is not necessary to form a high-mass metallic film as the at least one floating electrode. Therefore, compared to the case in which partial electrodes or dummy electrodes are provided in the related art which makes use of mass loading, material costs can be reduced, so that the at least one floating electrode can be easily provided.

When the first and second excitation electrodes of the piezoelectric vibration portion are arranged inwardly of the peripheral edges of the first and second principal surfaces of the piezoelectric substrate, respectively, annular areas where the excitation electrodes do not exist are provided between the first excitation electrode and first and second peripheral edges of the piezoelectric substrate and between the second excitation electrode and first and second peripheral edges of the piezoelectric substrate. Therefore, it is possible to provide the at least one floating electrode that is substantially annular or not annular at the annular areas.

When the at least one floating electrode is a substantially annular electrode disposed so as to surround the first excitation electrode and/or the second excitation electrode, it is possible to effectively cancel out the positive and negative electric charges generated by the fundamental wave in either location in a peripheral direction near the piezoelectric vibration portion.

When the at least one annular electrode is circular, it is isotropic, so that, it is possible to effectively and uniformly prevent the generation of the positive and negative electric charges contributing to excitation of the fundamental wave near the piezoelectric vibration portion.

An elongated strip piezoelectric resonator can be provided in accordance with a preferred embodiment of the present invention when the piezoelectric substrate has an elongated substantially rectangular plate shape, first and second end surfaces are positioned at respective ends in the longitudinal direction, the first excitation electrode is arranged so as to extend from the piezoelectric vibration portion to the pair of side edges at the two sides of the first principal surface of the piezoelectric substrate in the widthwise direction of the piezoelectric substrate, the second excitation electrode is arranged so as to extend to the pair of side edges at the two sides of the second principal surface in the widthwise direction of the piezoelectric substrate, and the vibration damping portion is disposed on both sides of the piezoelectric vibration portion in the longitudinal direction of the piezoelectric substrate.

In this case, the at least one floating electrode may be provided at only one side or at two sides of the first excitation electrode or the second excitation electrode. When the at least one floating electrode is provided at only one side, it is possible to simplify the electrode structure and to reduce material costs.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

With reference to the drawings, the present invention will hereunder be explained by describing preferred embodiments of the present invention.

Figure 1A:
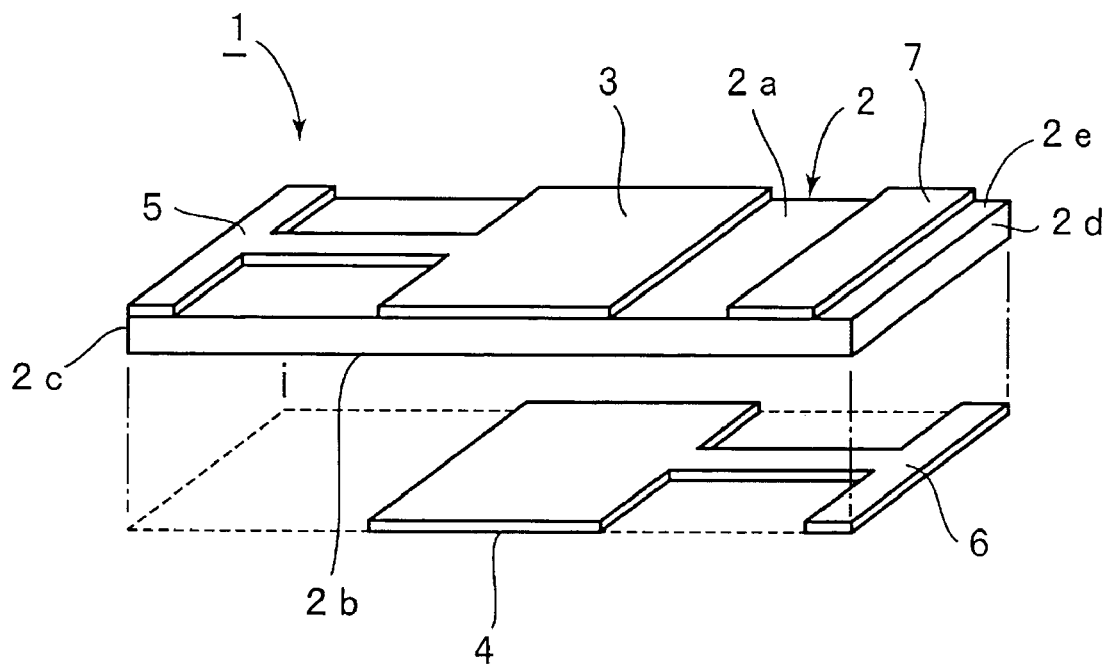
FIGS. 1A and 1B are, respectively, an external schematic perspective view and an external schematic front sectional view of a piezoelectric resonator according to a first preferred embodiment of the present invention.
Figure 1B:
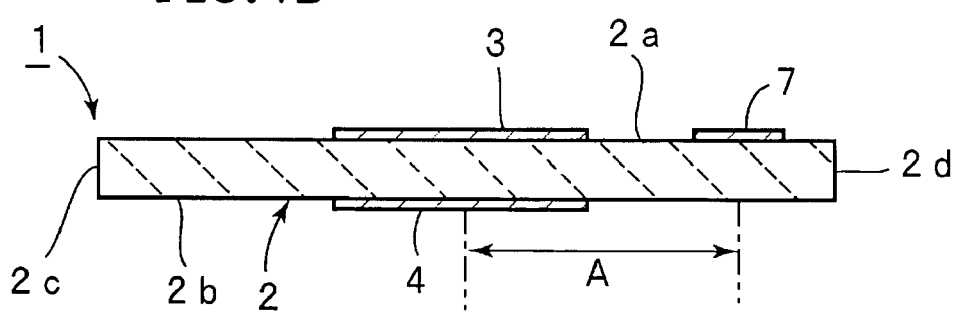

FIGS. 1A and 1B are, respectively, a perspective view and a schematic front sectional view of a piezoelectric resonator according to a first preferred embodiment of the present invention. A piezoelectric resonator 1 is an energy trap piezoelectric resonator using a third harmonic wave in a thickness longitudinal vibration mode.

The piezoelectric resonator 1 preferably has an elongated substantially rectangular plate, that is, a strip piezoelectric substrate 2. In a preferred embodiment, the piezoelectric substrate 2 is preferably formed of piezoelectric ceramics, such as lead zirconate titanate ceramics or lead titanate ceramics, and is polarized in a thickness direction.

A first excitation electrode 3 is provided at the center of an upper surface 2a of the piezoelectric substrate 2. The first excitation electrode 3 is preferably substantially rectangular, and is provided over the entire width of the piezoelectric substrate 2. In other words, the first excitation electrode 3 is arranged so as to extend to a pair of side edges of the upper surface 2a of the piezoelectric substrate 2.

A second excitation electrode 4 is provided at a lower surface 2b of the piezoelectric substrate 2 so as to oppose the first excitation electrode 3 with the piezoelectric substrate 2 disposed therebetween. The second excitation electrode 4 is also arranged over the entire width of the piezoelectric substrate 2, that is, so as to extend to a pair of side edges of the lower surface of the piezoelectric substrate.

The first excitation electrode 3 is electrically connected to an extraction electrode 5 provided on the upper surface 2a so as to extend along an edge defined by the upper surface 2a and a first end surface 2c at one end of the piezoelectric substrate 2 in a longitudinal direction. At the lower surface of the piezoelectric substrate 2, the second excitation electrode 4 is electrically connected to an extraction electrode 6. The extraction electrode 6 is provided on the lower surface 2b so as to extend along an edge formed by an end surface 2d, provided opposite to the first end surface 2c, and the lower surface 2b of the piezoelectric substrate 2.

At the upper surface 2a of the piezoelectric substrate 2, a floating electrode 7 is provided between the first excitation electrode 3 and the end surface 2d. In a preferred embodiment, the floating electrode 7 is provided over the entire width of the piezoelectric substrate 2. The floating electrode 7 is disposed apart from the end surface 2d by a gap 2e. In a preferred embodiment, as mentioned below, the floating electrode 7 is arranged so that at least one node of an electric potential distribution based on electric charges generated at the upper surface 2a of the piezoelectric substrate 2 by a fundamental wave in a thickness longitudinal vibration mode is positioned within the floating electrode 7.

FIG. 1B shows the excitation electrodes 3 and 4 and the floating electrode 7, which are main portions in the description of preferred embodiments of the present invention, and does not show the extraction electrodes 5 and 6.

In the piezoelectric resonator 1, when an AC electric field is applied between the excitation electrodes 3 and 4, an energy trap piezoelectric vibration portion undergoes excitation by a thickness longitudinal vibration. Here, a harmonic wave having an odd-numbered order, such as a third harmonic wave or a fifth harmonic wave of the fundamental wave in a thickness longitudinal vibration mode, is excited. In a preferred embodiment, a third harmonic wave in a thickness longitudinal vibration mode among excited waves is used. Therefore, it is desirable that the fundamental wave in a thickness longitudinal vibration mode be suppressed.

Figure 2A:
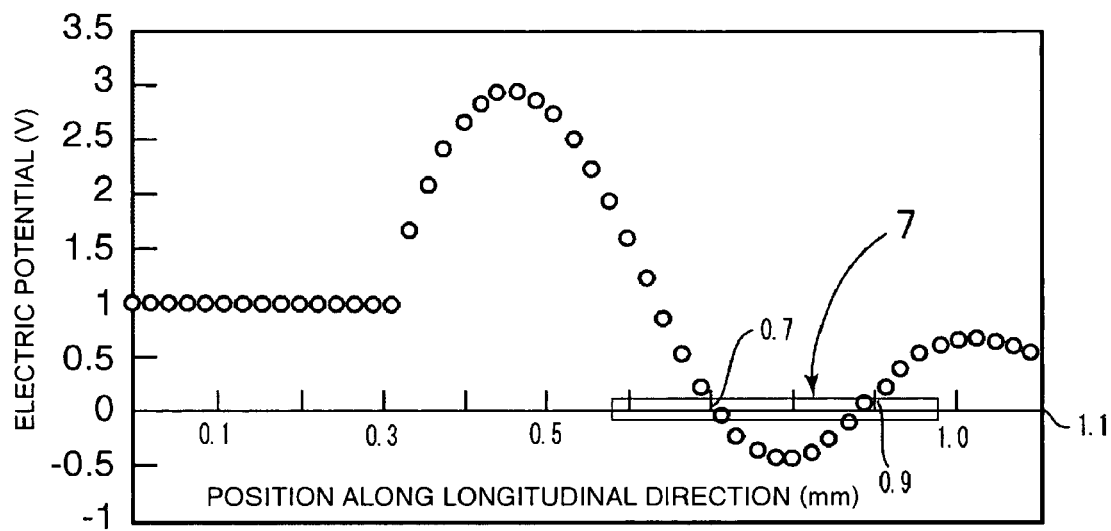
FIG. 2A is a graph showing an electric potential distribution based on electric charges generated by a fundamental wave in the piezoelectric resonator according to the first preferred embodiment.
Figure 2B:
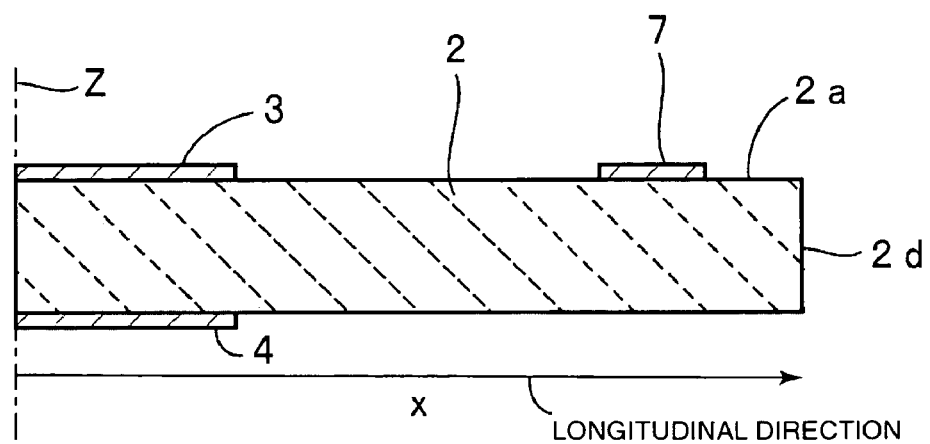
FIG. 2B is a schematic half sectional front view of the piezoelectric resonator, and is used to explain x coordinates along a horizontal axis in the electric potential distribution shown in FIG. 2A.

The fundamental wave in a thickness longitudinal vibration mode is excited. The fundamental wave does not have a tendency to be trapped. Thus, it is propagated from the piezoelectric vibration portion to a surrounding area. In this case, at the upper surface 2a and the lower surface 2b of the piezoelectric substrate 2, electric charges in correspondence with the vibration of the fundamental wave are generated, thereby generating an electric potential distribution. FIG. 2A is a graph showing an electric potential distribution that is generated at the upper surface 2a of the piezoelectric substrate 2 from the piezoelectric vibration portion towards the end face 2d. The electric potential distribution shown in FIG. 2A is an electric potential distribution of a state prior to providing the floating electrode 7. A 2.2 mm×0.54 mm×0.25 mm (thickness) piezoelectric substrate is preferably used as an example. In FIGS. 2A and 2B, the vertical axis represents the electric potential, and the horizontal axis represents the position along the longitudinal direction of the piezoelectric substrate 2. As shown in the schematic half sectional front view of the piezoelectric resonator 1 in FIG. 2B, the position along the aforementioned longitudinal direction refers to a coordinate system which increases towards the end surface 2d, with the position at a z axis passing through the center of the first excitation electrode 3 being defined as a 0 position. FIG. 2A shows the electric potential distribution when the length from the center of the first excitation electrode 3 to the end surface 2d is about 1.1 mm. In FIG. 2B, the extraction electrodes 5 and 6 are not shown as in FIG. 1B for the sake of easier understanding.

As is clear from FIG. 2A, nodes of the electric potential distribution exist at about 0.7 mm longitudinal position and at about 0.87 mm longitudinal position, respectively. In other words, when the position is less than about 0.7 mm, the polarity of an electric charge is positive, when it is in the range of from about 0.7 mm to about 0.87 mm, the polarity is negative, and when it is beyond about 0.87 mm, the polarity is positive.

In a preferred embodiment, the aforementioned electrode 7 is provided. The operational effects of the floating electrode 7 are described with reference to FIG. 2A. FIG. 2A schematically shows the position of the floating electrode 7. Here, the dimension of the floating electrode 7 in the longitudinal direction of the piezoelectric substrate 2 is about 0.4 mm, and the center of the floating electrode 7 in this longitudinal direction is situated at about the 0.77 mm position as a position along the longitudinal direction of the piezoelectric substrate 2 parallel with the horizontal axis in FIG. 2A. Since the dimension of the floating electrode 7 in the aforementioned longitudinal direction is about 0.4 mm which is relatively large, the two nodes are positioned within the floating electrode 7.

As mentioned above, the floating electrode 7 is constructed so as to have a certain longitudinal dimension along the aforementioned longitudinal direction. When attention is focused on one of the nodes of the electric potential distribution, with the node being an origin, the floating electrode 7 has a portion extending towards the first excitation electrode 3 and a portion extending away from the first excitation electrode 3. Since the node does not need to be positioned at the center of the floating electrode, the term "origin" is used.

In a preferred embodiment, since an electric charge generated at the portion of the floating electrode extending towards the first excitation electrode 3 with respect to the node and an electric charge generated at the portion of the floating electrode extending away from the first excitation electrode 3 with respect to the node have opposite polarities, the positive and negative electric charges are cancelled by the existence of the floating electrode 7. Therefore, since an electric potential distribution generated by the positive and negative electric charges is not easily generated, it is possible to effectively suppress the fundamental wave. This will be described in more detail with reference to FIG. 3.

Figure 3:
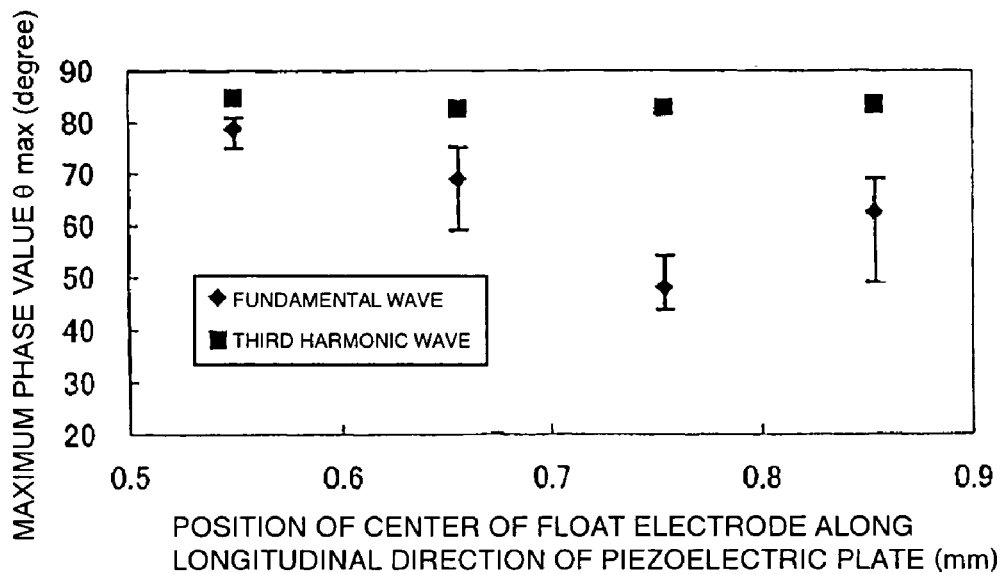
FIG. 3 is a graph showing changes in a fundamental wave suppression state when the position of a floating electrode is varied in the piezoelectric resonator according to the first preferred embodiment of the present invention.

FIG. 3 is a graph showing the response of the third harmonic wave and the fundamental wave in a thickness longitudinal vibration mode when the floating electrode 7 having a dimension of about 0.4 mm in the longitudinal direction of the piezoelectric substrate 2 is provided on the piezoelectric substrate 2, and the position of the center of the floating electrode 7 in the longitudinal direction of the piezoelectric substrate 2 is varied. In other words, the horizontal axis in FIG. 3, like the horizontal axis in FIGS. 2A and 2B, represents the position along the longitudinal direction of the piezoelectric substrate 2, and θmx at the vertical axis represents the maximum value of a phase of the fundamental wave and the third harmonic wave. The graph shows that the smaller the maximum value of the phase, the lower the response. Therefore, it is suppressed. As is clear from FIG. 3, the response of the fundamental wave is very low when the floating electrode 7 is near the 0.76 mm position along the longitudinal direction of the piezoelectric substrate 2. In contrast, the third harmonic wave in a thickness longitudinal vibration mode is virtually not suppressed even if the floating electrode 7 is near the 0.76 mm position in the longitudinal direction.

In the foregoing description, with reference to FIGS. 2A and 2B and FIG. 3, the example in which the floating electrode 7 is provided so that two nodes are positioned within the floating electrode 7 is used. Therefore, at each of the two nodes, the electric charge generated at the portion of the floating electrode disposed inwardly of the node and the electric charge generated at the portion of the floating electrode disposed outwardly of the node are cancelled.

The floating electrode 7 may be provided so that one of the aforementioned nodes is provided in the floating electrode 7.

Figure 4:
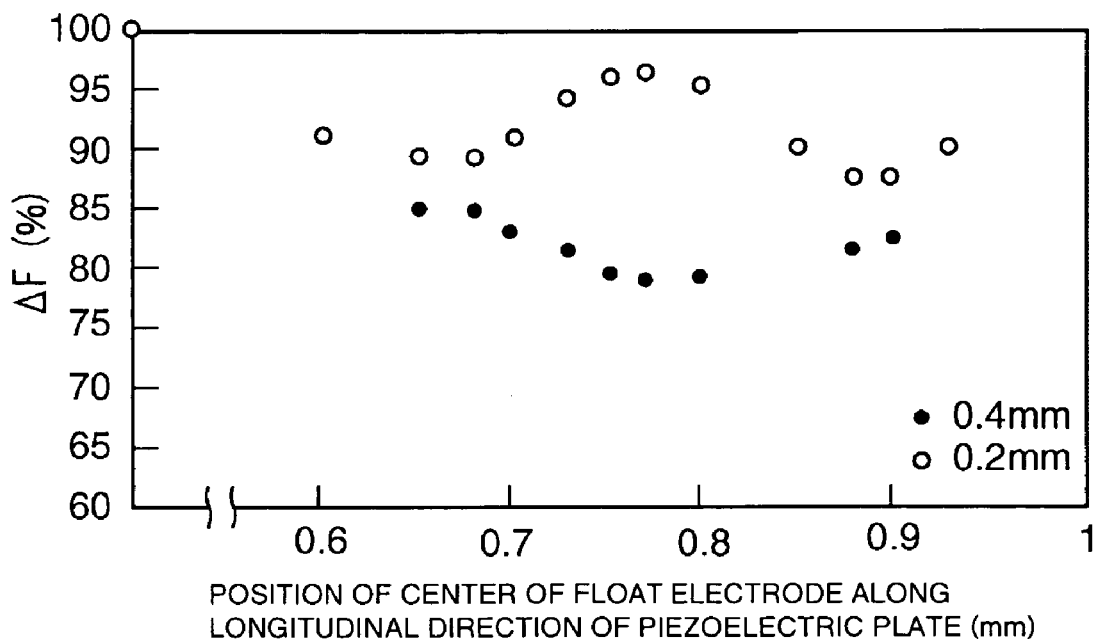
FIG. 4 is a graph showing the relationship between the response of the fundamental wave and the position of the floating electrode when the sizes of the floating electrode in a longitudinal direction of the piezoelectric substrate are about 0.2 mm and about 0.4 mm.
Figure 5:
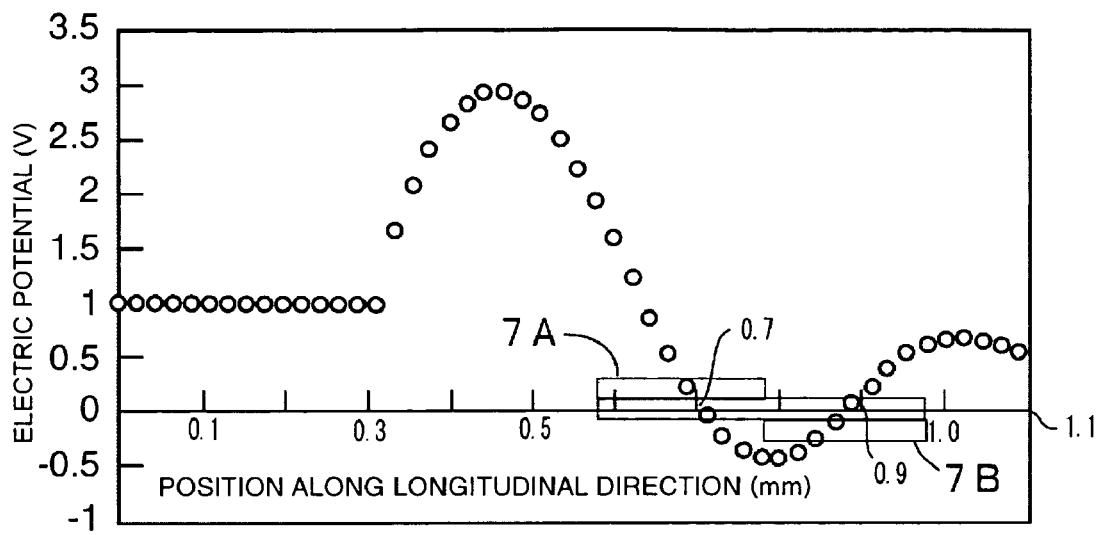
FIG. 5 is a graph showing the relationship between the position in the longitudinal direction of the piezoelectric substrate and the electric potential distribution based on the electric charges generated by the fundamental wave in a thickness longitudinal vibration mode.

In order to position one node in the floating electrode 7, the dimension of the floating electrode 7 in the longitudinal direction of the piezoelectric substrate 2 is made small. FIGS. 4 and 5 are graphs for illustrating the operational effects of the floating electrode 7 when the dimension of the floating electrode 7 in the longitudinal direction of the piezoelectric substrate 2 is varied.

FIG. 4 is a graph showing the relationship between the response of the fundamental wave and the position of the floating electrode when the dimensions of the floating electrode 7 in the longitudinal direction of the piezoelectric substrate 2 are about 0.2 mm and about 0.4 mm, for example. The horizontal axis in FIG. 4 represents the position of the center of the floating electrode 7 along the longitudinal direction of the piezoelectric substrate 2. ΔF(%) at the vertical axis is obtained by standardizing ΔF when the floating electrode is not provided, with ΔF being a proportion with respect to fr of the absolute value of fa−fr when the resonant frequency of the fundamental wave is fr and its antiresonant frequency is fa. ΔF(%) is proportional to the magnitude of the response of the fundamental wave. The smaller ΔF is, that is, the smaller ΔF(%) is, the more the fundamental wave is suppressed.

As is clear from FIG. 4, when the dimension of the floating electrode 7 along the aforementioned longitudinal direction is about 0.2 mm, the positions of the floating electrode along the aforementioned longitudinal direction where the fundamental wave is suppressed are at about 0.65 mm to about 0.70 mm and at about 0.86 mm to about 0.92 mm, and, when the dimension of the floating electrode 7 in the aforementioned longitudinal direction is about 0.4 mm, the positions are at about 0.76 mm to about 0.80 mm.

As shown in FIG. 2A, in the electric potential distribution here, two vibration nodes exist. Therefore, as is clear from FIG. 4, when the dimension of the floating electrode 7 in the longitudinal direction of the piezoelectric substrate 2 is 0.4 mm, the results shown in FIGS. 2A and 3 do not contradict with the results shown in FIG. 4. In other words, from FIG. 4, it can be understood that, when the dimension of the floating electrode in the aforementioned longitudinal direction is about 0.4 mm, the center of the floating electrode 7 is positioned between about 0.74 to about 0.80 mm along the aforementioned longitudinal direction. Since, in FIG. 2A, the longitudinal position is about 0.77 mm, the response of the fundamental wave is suppressed as shown in FIG. 3.

As shown in FIG. 4, it can be understood that, when the dimension of the floating electrode 7 in the aforementioned longitudinal direction is about 0.2 mm, as mentioned above, the fundamental wave is suppressed when the longitudinal position is from about 0.65 to about 0.70 mm and is from about 0.86 to about 0.92 mm. This will be described in more detail with reference to FIG. 5. An electric potential distribution shown in FIG. 5 is the same as that shown in FIG. 2A, and is that generated by a fundamental wave that is excited prior to the formation floating electrodes 7. FIG. 5 is a schematic view showing the positions of two floating electrodes 7A and 7B.

Here, the inner floating electrode 7A is disposed near the 0.70 mm position along the aforementioned longitudinal direction, and the outer floating electrode 7B is disposed near the 0.87 mm position along the aforementioned longitudinal direction. Therefore, it can be understood that, even in this structure, positive and negative electric charges generated by the fundamental wave at the floating electrodes 7A and 7B are cancelled, so that the electric potential distribution based on the electric charge distribution is suppressed. In other words, it can be understood that, in FIG. 2A, the positive and negative electric charges at the two nodes are cancelled by one floating electrode 7, whereas, in FIG. 5, the positive and negative electric charges are cancelled at the nodes where the respective floating electrodes 7A and 7B are disposed.

In FIG. 5, one of the nodes is positioned at the floating electrode 7A, and the other node is positioned at the floating electrode 7B. However, even if only one of the floating electrodes is used, the fundamental wave can be suppressed. For example, when only the floating electrode 7A is disposed near the approximately 0.70 mm position along the aforementioned longitudinal direction, the floating electrode 7A causes the positive and negative electric charges generated by the fundamental wave to be cancelled, so that the electric potential distribution based on the electric charge distribution is suppressed. Therefore, when a plurality of nodes exist, it is not necessary to dispose floating electrodes at all of the nodes. As mentioned above, according to a preferred embodiment, the fundamental wave in a thickness longitudinal vibration mode can be suppressed, but the third harmonic wave in a thickness longitudinal vibration mode is virtually not suppressed.

Therefore, the third harmonic wave in a thickness longitudinal vibration mode can be efficiently used. In particular, since, as mentioned above, the floating electrode 7 functions so that positive and negative electric charges are not easily generated by the fundamental wave, the mass of the floating electrode 7 does not need to be very large. In other words, the floating electrode 7 is formed of an electrically conductive material without its mass being particularly limited. Therefore, material costs are not increased.

In addition, since mass loading is not used, when the floating electrode 7 has a small mass, the third harmonic wave has a low probability of being suppressed. Therefore, while the fundamental wave in a thickness longitudinal vibration mode is effectively suppressed, the response of the third harmonic wave can be made sufficiently high.

The suppression of the fundamental wave by the existence of the floating electrode 7 in a preferred embodiment will be described with reference to specific, non-limiting experimental examples.

A lead titanate ceramics substrate was used as the aforementioned piezoelectric substrate, excitation electrodes 3 and 4 were approximately 0.3×0.54 mm, and an Ag film was provided as the floating electrode 7, with the dimension of the Ag film in the longitudinal direction of the piezoelectric substrate 2 being about 0.4 mm, the dimension of the Ag film in the widthwise direction of the piezoelectric substrate 2 being about 0.54 mm, and the thickness of the Ag film being about 0.3 μm. The position of the floating electrode 7 was varied in terms of an x coordinate in order to evaluate the response of the fundamental wave. The results are shown in FIG. 3.

Accordingly, it can be understood that the response of the fundamental wave can be effectively suppressed by disposing the floating electrode 7 near the approximately 0.78 mm position where the node of the electric potential distribution based on the positive and negative electric charges generated by the fundamental wave shown in FIG. 2 is situated.

In the piezoelectric resonator according to a preferred embodiment of the present invention, when a plurality of nodes of the electric potential distribution generated by propagation of the fundamental wave in the piezoelectric substrate exist, a floating electrode may be disposed at each of the plurality of nodes, or a floating electrode may be disposed at least one of the plurality of nodes. Desirably, a floating electrode is disposed at each of the plurality of nodes, so that the fundamental wave can be more effectively suppressed.

Figure 6:
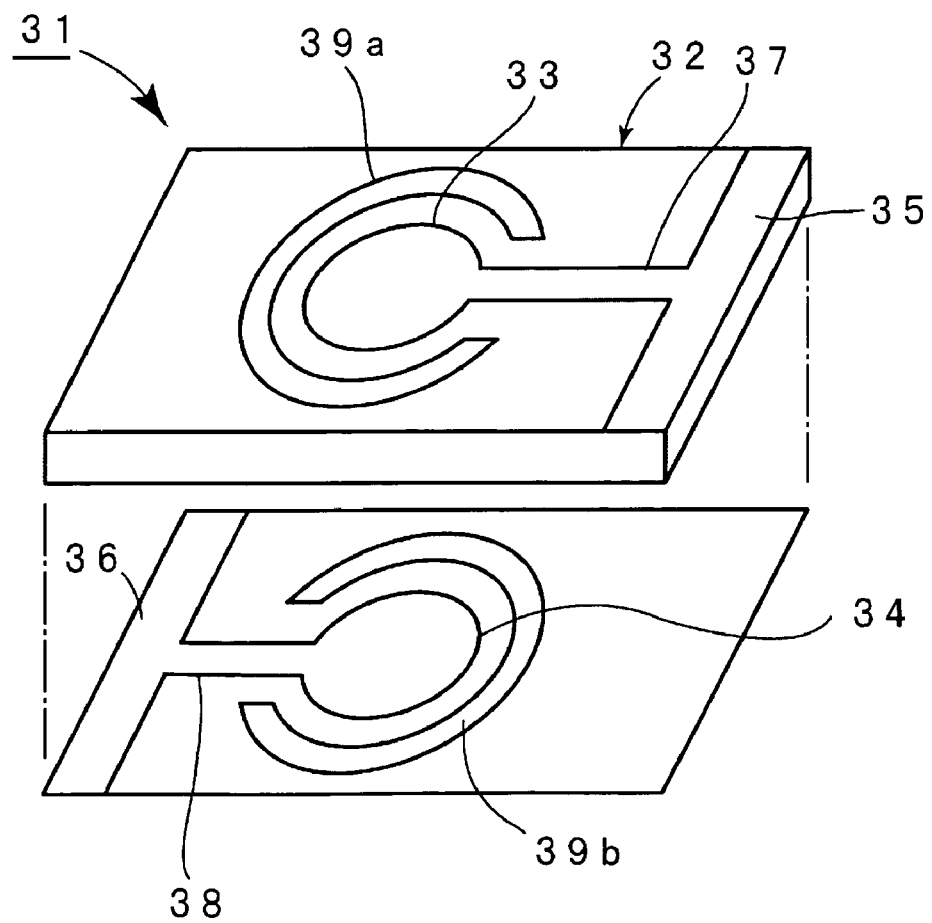
FIG. 6 is a schematic perspective view of a piezoelectric resonator of a modification according to a preferred embodiment of the present invention.

The piezoelectric resonator according to a preferred embodiment of the present invention is not limited to the strip piezoelectric resonator 1 shown in FIG. 1. Piezoelectric resonators of modifications according to other preferred embodiments of the present invention will be described with reference to FIGS. 6 to 10. In a piezoelectric resonator 31 of a modification shown in FIG. 6, a substantially circular first excitation electrode 33 is provided at the center of an upper surface of a rectangular plate piezoelectric substrate 32, and a substantially circular second excitation electrode 34 is provided at a lower surface. Here, the excitation electrodes 33 and 34 are electrically connected to respective extraction electrodes 35 and 36 through respective elongated wiring electrodes 37 and 38. Substantially C-shaped floating electrodes 39a and 39b having slits are provided so as to avoid portions where the wiring electrodes 37 and 38 are provided. Accordingly, in the structure having the wiring electrodes 37 and 38, the floating electrodes 39a and 39b may have C-shaped forms having slits. In other words, they do not need to have closed circular forms.

Figure 7:
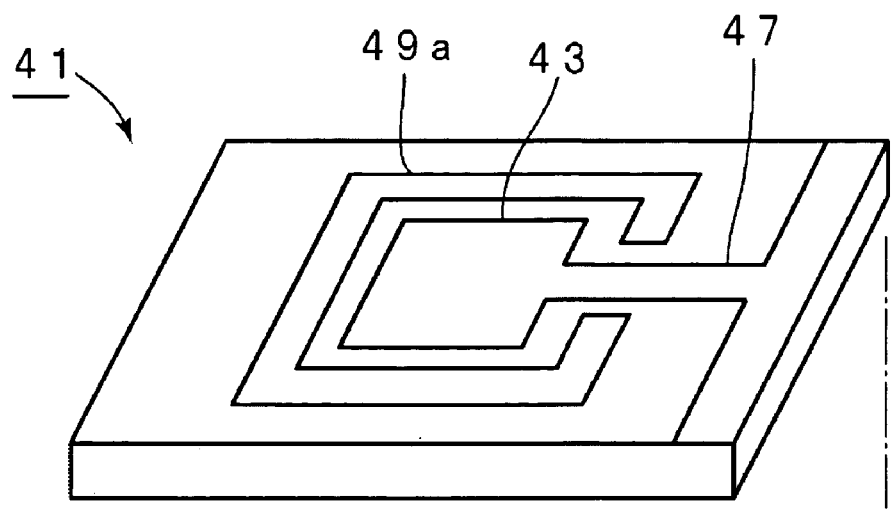
FIG. 7 is a schematic perspective view of a piezoelectric resonator of another modification according to a preferred embodiment of the present invention.

FIG. 7 is a perspective view of a piezoelectric resonator of another modification according to a preferred embodiment of the present invention. Here, in a piezoelectric resonator 41, a substantially rectangular first excitation electrode 43 is provided at an upper surface of a substantially rectangular plate piezoelectric substrate 42, and a substantially rectangular second excitation electrode 44 is provided at a lower surface. Partially rectangular, frame-like floating electrodes 49a and 49b are provided around respective excitation electrodes 43 and 44 at portions where respective wiring electrodes 47 and 48 are extracted. The partially rectangular, frame-like floating electrodes 49a and 49b have slits provided so as to avoid portions where the wiring electrodes 47 and 48 are provided. Accordingly, the excitation electrodes may be substantially rectangular, and rectangular frame-like electrodes like the floating electrodes 49a and 49b may be provided.

Figure 8:
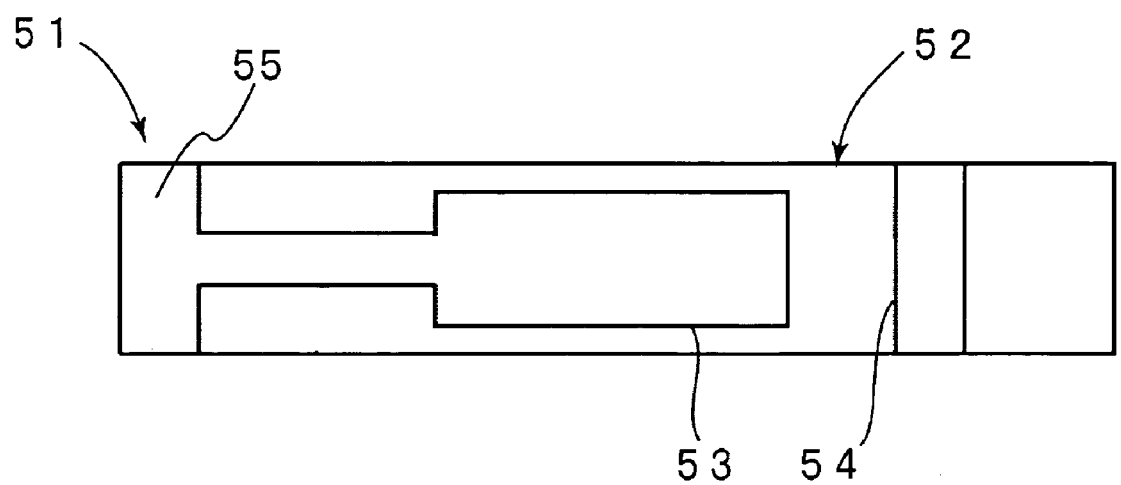
FIG. 8 is a bottom view for illustrating a piezoelectric resonator of still another modification according to a preferred embodiment of the present invention.

FIG. 8 is a bottom view of a piezoelectric resonator of still another modification according to a preferred embodiment of the present invention. A piezoelectric resonator 51 shown in FIG. 8 has an elongated substantially rectangular plate, that is, a strip piezoelectric substrate 52. A second excitation electrode 53 is provided at the center of a lower surface of the piezoelectric substrate 52. The second excitation electrode 53 is electrically connected to an extraction electrode 55. Here, a first excitation electrode at the upper surface is not shown. The first excitation electrode is disposed so as to oppose the excitation electrode 53, with the piezoelectric substrate 52 disposed therebetween, in a thickness direction. A floating electrode 54 is provided at the lower surface of the piezoelectric substrate 52. A floating electrode is not provided at the upper surface. Accordingly, in the elongated strip piezoelectric resonator 51, only the lower surface may be provided with the floating electrode 54.

Figure 9:
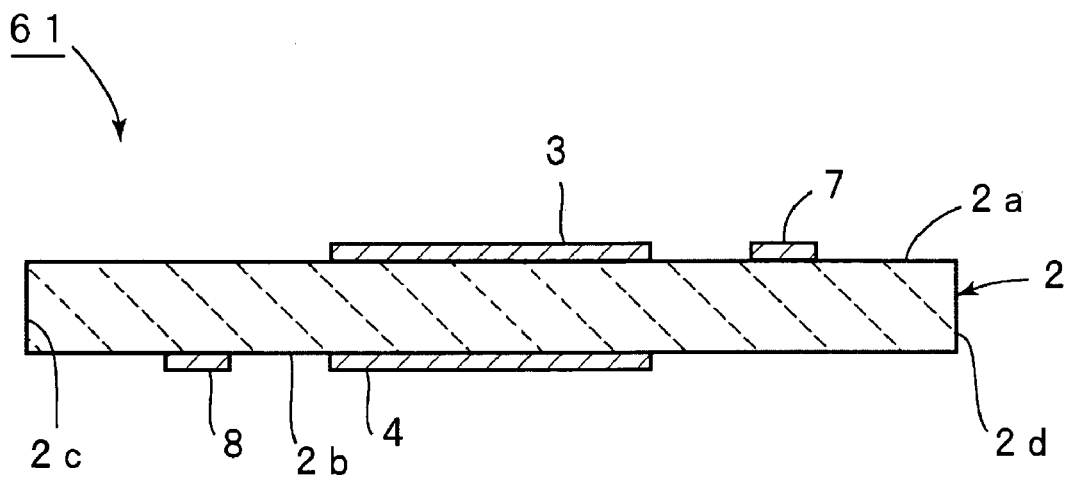
FIG. 9 is a schematic front sectional view for illustrating a piezoelectric resonator of still another modification according to a preferred embodiment of the present invention.
Figure 10:
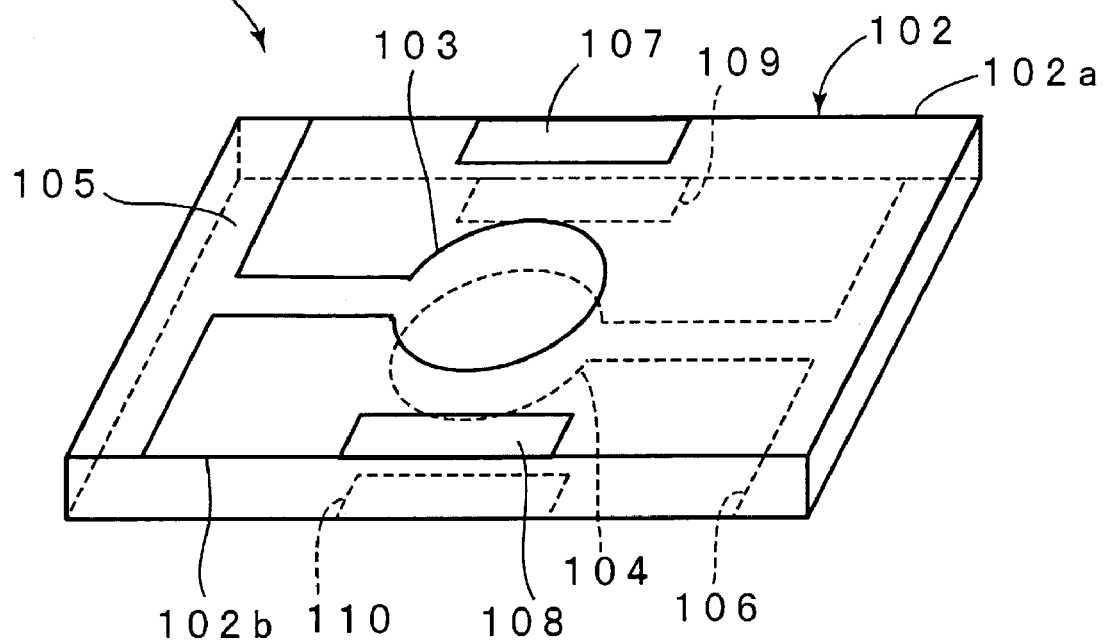
FIG. 10 is a perspective view of an example of a related piezoelectric resonator.
Figure 11:
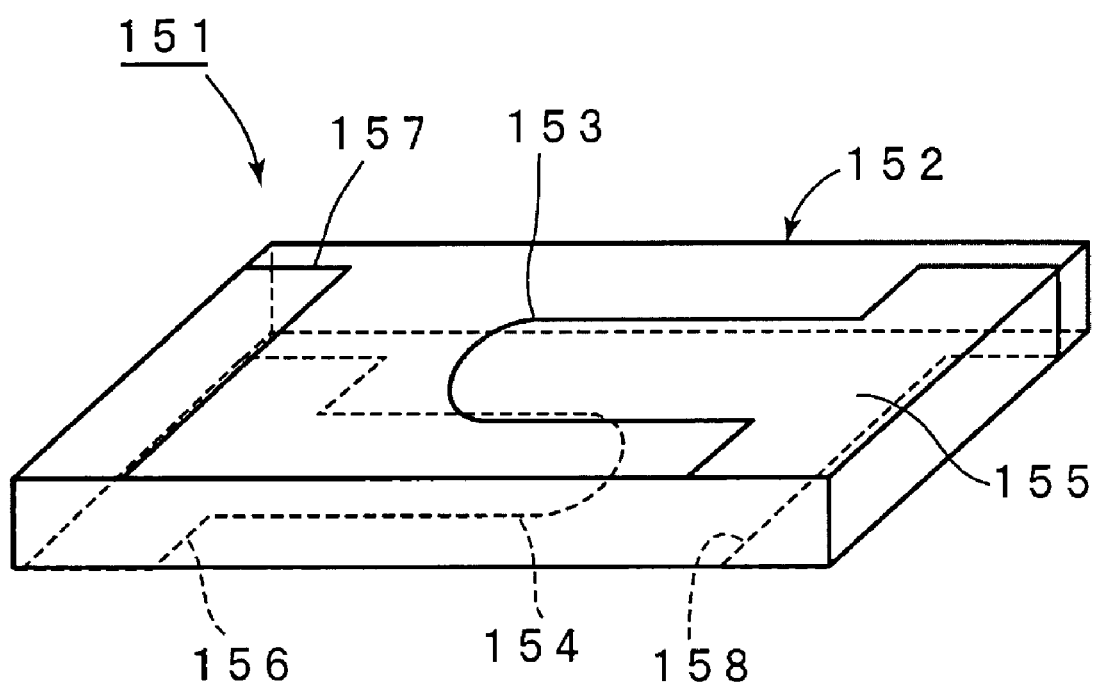
FIG. 11 is a perspective view of another example of a related piezoelectric resonator.

FIG. 9 is a schematic front sectional view of a piezoelectric resonator of still another modification according to a preferred embodiment of the present invention. A piezoelectric resonator 61 of this practical form has the same structural features as those of the piezoelectric resonator 1 shown in FIG. 1 except that a floating electrode 8 is provided at a lower surface of a piezoelectric substrate 2. As is clear from the piezoelectric resonator 61, not only may a floating electrode be provided at an upper surface 2a of the piezoelectric substrate 2, but also the floating electrode 8 may be disposed at a lower surface 2b. In other words, in the present preferred embodiment of the present invention, a floating electrode is provided at least one of the first and second principal surfaces of the piezoelectric substrate. In FIG. 9, extraction electrodes are not shown as in FIG. 1B.

Although, in the above-described preferred embodiments and modifications, the piezoelectric resonator is described as making use of the third harmonic wave in a thickness longitudinal vibration mode, the piezoelectric resonator may make use of other harmonic waves in a thickness longitudinal vibration mode such as a fifth harmonic wave.

While the present invention has been described with respect to preferred embodiments thereof, it will be apparent to those skilled in the art that the disclosed invention may be modified in numerous ways and may assume many preferred embodiments other those specifically set out and described above. Accordingly, it is intended by the appended claims to cover all modifications of the present invention which fall within the true spirit and scope of the present invention.

The invention claimed is:

1. An energy trap piezoelectric resonator making use of a harmonic wave in a thickness longitudinal vibration mode, comprising:

a piezoelectric substrate having opposing first and second principal surfaces;

a first excitation electrode disposed at the first principal surface of the piezoelectric substrate, and a second excitation electrode disposed at the second principal surface of the piezoelectric substrate so as to oppose the first excitation electrode, a portion where the first and second excitation electrodes oppose each other being a piezoelectric vibration portion; and at least one floating electrode disposed at at least one of the first and second principal surfaces of the piezoelectric substrate so as to be arranged near the piezoelectric vibration portion and so as to extend towards and away from the first and second excitation electrodes with respect to a node of an electric potential distribution based on electric charges generated at the first and second principal surfaces of the piezoelectric substrate by a fundamental wave in a thickness longitudinal vibration mode; and the at least one floating electrode includes a vibration damping portion arranged to suppress a fundamental wave in a thickness longitudinal vibration mode.

2. The energy trap piezoelectric resonator according to claim 1, wherein the first and second excitation electrodes are disposed inwardly of peripheral edges of the respective first and second principal surfaces of the piezoelectric substrate.

3. The energy trap piezoelectric resonator according to claim 2, wherein the at least one floating electrode is a substantially annular electrode arranged so as to surround at least one of the first excitation electrode and the second excitation electrode.

4. The energy trap piezoelectric resonator according to claim 3, wherein the at least one annular electrode is substantially circular.

5. The energy trap piezoelectric resonator according to claim 3, wherein the at least one annular electrode is at least partially rectangular.

6. The energy trap piezoelectric resonator according to claim 1, wherein the piezoelectric substrate has an elongated substantially rectangular plate shape, the first excitation electrode is disposed so as to extend to a pair of side edges at two sides of the first principal surface of the piezoelectric substrate in a widthwise direction of the piezoelectric substrate, the second excitation electrode is disposed so as to extend to a pair of side edges at two sides of the second principal surface of the piezoelectric substrate in the widthwise direction of the piezoelectric substrate, and the vibration damping portion is disposed on both sides of the piezoelectric vibration portion in a longitudinal direction of the piezoelectric substrate.

7. The energy trap piezoelectric resonator according to claim 1, wherein the at least one floating electrode includes two floating electrodes, one floating electrode disposed on the first principal surface and the other floating electrode disposed on the second principal surface.

8. The energy trap piezoelectric resonator according to claim 1, wherein the at least one floating electrode includes only a single floating electrode, the single floating electrode disposed on only one of the first principal surface or the second principal surface.

9. The energy trap piezoelectric resonator according to claim 1, wherein the at least one floating electrode includes an inner floating electrode disposed at a first node of the electric potential distribution and an outer floating electrode disposed at a second node of the electric potential distribution, wherein the inner floating electrode is disposed between the first or second excitation electrode and the outer floating electrode.

10. The energy trap piezoelectric resonator according to claim 1, wherein the at least one floating electrode is disposed at a first node of the electric potential distribution and at a second node of the electric potential distribution.

11. The energy trap piezoelectric resonator according to claim 6, wherein the at least one floating electrode is disposed at only one side of at least one of the first excitation electrode or the second excitation electrode in the longitudinal direction of the piezoelectric substrate.

* * * * *